INVENTORS
HOLLIS L. CASWELL
EMANUEL STERN

BY S. P. Tedesco

ATTORNEY

United States Patent Office 3,400,066
Patented Sept. 3, 1968

3,400,066
SPUTTERING PROCESSES FOR DEPOSITING THIN FILMS OF CONTROLLED THICKNESS
Hollis L. Caswell and Emanuel Stern, Mount Kisco, N.Y., assignors to International Business Machines Corporation, Armonk, N.Y., a corporation of New York
Filed Nov. 15, 1965, Ser. No. 507,729
21 Claims. (Cl. 204—192)

This invention relates generally to sputtering processes for depositing thin films and, more particularly, to the fabrication by such processes of thin film resistor elements exhibiting reproducible characteristics. In its particular aspects, this invention includes the capability of precisely controlling the sheet resistivity $\rho_s$ and also thickness $t$ of thin metallic films, or depositants.

At the present time, industry is developing an integrated circuit technology whereby large numbers of circuit components, both active and passive, are formed on a same supporting substrate. Such substrate may be formed, for example, of semiconductor material and comprise an integral part of the active and/or passive circuit components. The objectives of this development are to reduce the size, weight, and unit cost of individual circuit components and, also, improve reliability and power utilization from a system viewpoint.

Generally, resistor elements suitable for integrated circuits have been formed on a substrate either as thin metallic films and/or as controlled diffusions of predetermined geometries to exhibit a desired resistance. Thin film resistor elements are preferred since they provide certain advantages over diffused-type resistor elements. For example, thin film resistor elements do not consume valuable substrate surface area whereby the packing density of active circuit components is increased; they can be fabricated with greater precision and independently of the active circuit components; they are less temperature sensitive; and, they exhibit a wider resistance range.

Metallic films suitable for defining thin film resistor elements can be formed by evaporation and by sputtering processes. Both evaporation and sputtering processes exhibit a common limitation, i.e., the inability to precisely control sheet resistivity $\rho_s$. Generally, in such processes, a thin metallic film is formed over an entire substrate surface and photolithographic techniques are practiced to define a particular geometry which, for a given sheet resistivity $\rho_s$, provides a particular resistance. Sheet resistivity $\rho_s$ is defined by the relation $\rho_s=\rho_b/t$, where $\rho_b$ and $t$ are the bulk resistivity and thickness, respectively, of a thin metallic film. In a production scheme wherein the geometry of thin film resistor elements are fixed, reproducibility is predicated upon a precise control of the bulk resistance $\rho_b$ which varies as a function of composition, structure, purity, etc., and, also, thickness $t$ of the deposited metallic film. Small variations in sheet resisitivity $\rho_s$ of a thin metallic film pattern defining a resistor element can be sufficient to exceed tolerance requirements. At the present time, the inability to precisely reproduce sheet resistivity $\rho_s$ of deposited thin metallic films has necessitated individual testing and physical trimming of the thin film resistor elements to satisfy tolerance requirements. As the speed requirements of integrated circuits increase, the packing densities of the circuit components, both active and passive, will be increased. Thus, physical trimming of individual thin film resistor elements will become impractical.

The following are among the requirements that will be imposed on thin film resistor elements when used in high speed circuits: (1) low resistance values in the range of 10 ohms to 500 ohms; (2) precision better than 5%; and, (3) temperature coefficient of resistance less than 100 p.p.m./° C. To satisfy such requirements, a process must, therefore, provide reproducible thin film resistors formed of appropriate alloy material, e.g., nickel chromium alloys, and effect precise control of sheet resistivity $\rho_s$ within, say, $\pm 1\%$. When bulk resistivity $\rho_b$ and thickness $t$ are reproduced, a given thin film resistor geometry when formed over different portions of a substrate surface or when fabricated on different substrates will exhibit a same resistance. In such event, individual trimming of thin film resistor elements is avoided and the manufacturing process is simplified.

Accordingly, an object of this invention is to provide a process for fabricating precision thin film resistor elements.

Another object of this invention is to provide a method for forming thin film resistor elements having reproducible characteristics.

Another object of this invention is to provide a process for depositing thin layers of resistive material whereby sheet resistivity $\rho_s$ is controlled within a range of $\pm 1\%$.

Another object of this invention is to provide an improved sputtering process wherein the thickness $t$ of a deposited layer is precisely controlled.

Another object of this invention is to provide an improved process for depositing thin film resistor elements formed of alloy materials.

Another object of this invention is to provide an improved sputtering process for depositing a thin metallic film of alloy material having a reproducible composition.

These and other objects and features of this invention are achieved by an improved sputtering process wherein the effects of gaseous contaminants are minimized and wherein the sputtering yield per ion incident on the target structure is predetermined to achieve precise control of film composition and thickness.

One aspect of the present invention is an appreciation that residual active gases, e.g., nitrogen, oxygen, methane, etc., present in a sputtering atmosphere play a dominant role and contaminate a thin metallic film. Accordingly, and since the respective partial pressures of such residual active gases may vary from run to run, the bulk resistivity $\rho_b$ of the thin metallic films deposited in a same sputtering system is not reproducible. For example, it has been observed that when system pressures have been reduced to $1\times 10^{-7}$ torr as compared to $5\times 10^{-7}$ torr prior to introduction of the sputtering atmosphere, the residual active gases can affect the bulk resistivity $\rho_b$ of deposited thin metallic films by as much as 10%. In accordance with the present invention, bulk resistivity $\rho_b$ of a deposited thin metallic film is reproducible if residual active gases are substantially totally removed from the sputtering system prior to introduction of the sputtering atmosphere or the partial pressure of such gases is carefully controlled. Therefore, in accordance with one aspect of this invention, system pressures are initially reduced in excess of $1\times 10^{-7}$ torr and to a practical limit, e.g., $1\times 10^{-10}$ torr, which, when coupled with appropriate DC substrate biasing, e.g., between $-100$ volts and $-200$ volts, and temperature control, e.g., between 100° C. and 200° C., results in a deposited thin metalic film having a resistivity $\rho_b$ substantially equal to the bulk resistivity of the target material (cathode) and, hence, is reproducible. A DC bias sputtering process has been described, for example, in "Thin Films Deposited by Bias Sputtering," by L. I. Maissel et al., Journal of Applied Physics, vol. 36, No. 1, January 1965. In such process, negative substrate bias during deposition subjects the metallic film while being deposited to low energy ion bombardment, or "clean-up," whereby adsorbed impurity atoms are removed and higher purity results.

To provide a reproducible sheet resistivity $\rho_s$ so as to define precision thin film resistor elements, it is necessary also that the thickness $t$ of deposited thin metallic films be precisely determined. Such reproducibility is achieved by establishing a known, or predetermined, sputtering yield per incident ion on the target surface. In accordance with another aspect of this invention, a known sputtering rate is achieved by controlling the respective partial pressures of residual nonactive gases, e.g., hydrogen, within the system during the deposition process. For example, it is known that the major constituent of the gas background at pressures in the $5\times10^{-8}$ torr range is water vapor ($H_2O$); further, mass spectograph studies of the glow discharge struck during a sputtering process indicate that water vapor dissociates to introduce free hydrogen into the sputtering atmosphere. The partial pressure of water vapor and, hence, the partial pressure of hydrogen during deposition is very much dependent upon the immediate past history of the system, e.g., exposure time to the atmosphere, humidity of the atmosphere when exposed, wall surface conditions, etc. Accordingly, in prior art systems, successive depositions of thin metallic films are effected in sputtering atmospheres having different hydrogen partial pressures. It has been appreciated that, for a given system parameter, a direct correlation exists between the partial pressure of hydrogen and the thickness $t$ of a deposited thin metallic film. For example, for a given ion charge $I_c$ at the target structure (cathode), the hydrogen partial pressure has a major effect on sputtering yield. When the hydrogen partial pressure is determined, however, the thickness $t$ and, hence, the sheet resistivity $\rho_s$ of a thin metallic film for given system parameters is precisely indicated by the total ion charge Q at the target structure. The sputtering system, therefore, is calibrated for various partial pressures of hydrogen and/or other residual nonactive gases and system parameters are established, thin metallic films having reproducible sheet resistance $\rho_s$ are deposited. The sputtering system is calibrated by establishing residual nonactive gas, e.g., hydrogen, at predetermined partial pressures, or, alternatively, predetermined ratios of such gases to the sputtering atmosphere, e.g., argon, so as to provide a known sputtering yield per ion incident on the target structure. Accordingly, a given total ion charge Q to the cathode structure indicates the deposition of a thin metallic film of particular thickness $t$.

The foregoing and other objects, features and advantages of the invention will be apparent from the following more particular description of preferred embodiments of the invention, as illustrated in the accompanying drawings.

Figure 1:
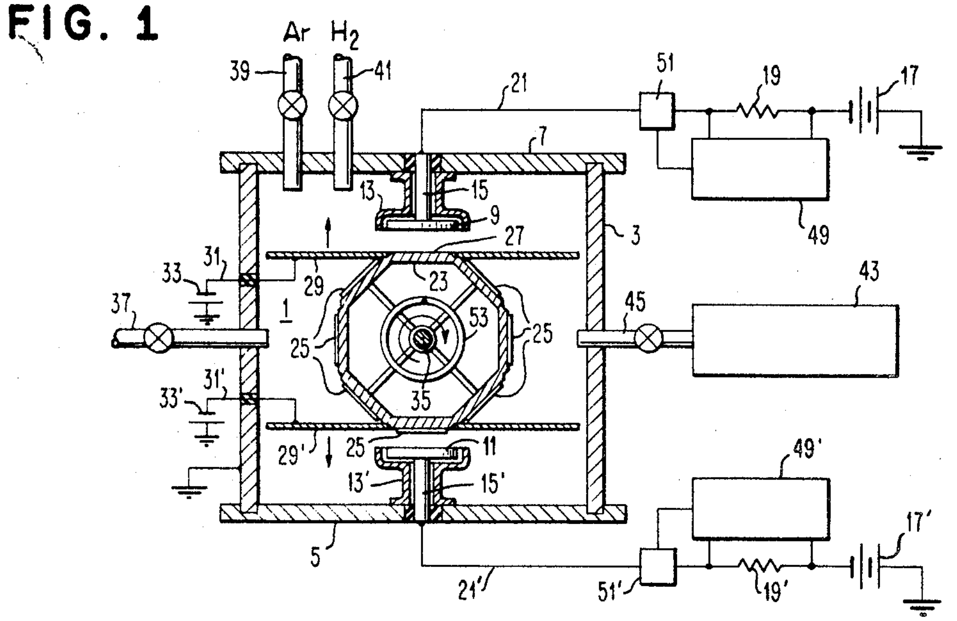
FIG. 1 is a cross-sectional view of a sputtering system embodying the principles of this invention.

Referring to FIG. 1, a dual cathode DC sputtering apparatus is shown as comprising a sputtering chamber 1 including a cylindrical member 3 supported within appropriate recesses contained in lower and upper plate members 5 and 7. Cylindrical member 3 and plate members 5 and 7, when joined, define a high vacuum chamber capable of maintaining pressures at least of $10^{-10}$ torr. Cylindrical member 3 and, also, plate members 5 and 7 are formed of metallic material, and are maintained at ground potential to serve as an anode during the deposition process.

A first target structure 9 is supported from upper plate member 7 and within a shield member 13 by a conductive post 15; and a second target structure 11 is supported from lower plate member 5 and within a shield member 13' by a conductive post 15'. Posts 15 and 15' extend through effective vacuum seals in upper and lower plate members 7 and 5, respectively. As shown, the respective planar surfaces of targets 9 and 11 are registered and in parallel planes. Targets 9 and 11, respectively, are connected to high voltage sources 17 and 17', i.e., in the range of −1000 volts to −5000 volts, along dropping resistors 19 and 19' and leads 21 and 21' connected at posts 15 and 15'. As hereinafter described, precision resistors 19 and 19' are used to monitor ion charge $I_c$ to targets 9 and 11, respectively, which provides an indication of depositant thickness $t$ during the sputtering process.

Target 9 comprises the particular material from which thin film resistors are to be formed. In the described process, target 9 is formed of 80–20 nickel-chromium alloy; target 11 is formed of a suitable contact metallurgy, e.g., aluminum, gold, etc. which is deposited as a protective layer over a thin nickel-chromium layer without breaking the chamber 1. Such protective layer prevents oxidation so as to facilitate etching of the thin nickel-chromium alloy layer. While 80–20 nickel-chromium alloy is described, it is evident that other suitable metals and alloy materials can be similarly employed, e.g., 76–18 nickel-chromium including small percentages of silicon and aluminum, 74–16 nickel-chromium alloy including small percentages of iron and silicon (Karma), and copper-nickel alloys (Manganin).

Rotatable octangular structure 23 formed of conductive material is positioned intermediate targets 9 and 11, the particular surfaces thereof being adapted to support and electrically contact substrate 25 upon which a nickel-chromium alloy film is to be deposited. Substrates 25 are supported, in turn, adjacent targets 9 and 11 and spaced to support a glow discharge therebetween. One surface 27 of structure 23 does not support a substrate but, rather, is used during presputtering of targets 9 and 11 to remove surface contaminants, e.g., oxidized layers, and establish system equilibrium prior to actual deposition. The surface of substrates 25 not positioned adjacent targets 9 and 11 are protected by annular shutter elements 29 and 29' formed of conductive material. The interior edges of shutter elements 29 and 29' are received within recesses cut in the apexes of structure 23; exterior edges of shutter elements 29 and 29' are closely spaced with the interior surface of cylindrical member 3 to define distinct sputtering chambers. Shutter elements 29 and 29', respectively, are connected along leads 31 and 31' which extend through effective vacuum seals in cylindrical member 3 to negative voltage sources 33 and 33' utilized for substrate biasing. When shutter elements 29 and 29' contact structure 23, substrates 25 are biased, say, at −150 volts. During deposition, only substrates 25 positioned adjacent targets 9 or 11 are exposed to sputtered target materials whereas remaining substrates 25 are protected. Shutter elements 29 and 29' are movable in a vertical direction, as indicated by arrows, to allow rotation of structure 23 about shaft 35 and successive positioning of substrates 25 adjacent targets 9 and 11, respectively.

Figure 3:
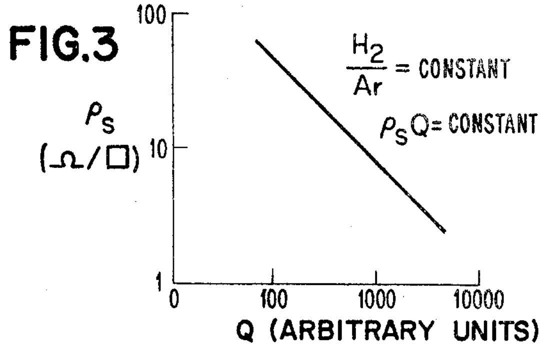
FIG. 3 is a curve illustrating variations in sheet resistivity $\rho_s$ of a deposited thin metallic film as a function of total charge Q to the target structure for a predetermined ratio $H_2/Ar$ in the sputtering atmosphere.

The interior of chamber 1 is connected along valved duct 37 to a high-efficiency vacuum pump system, not shown, capable of reducing pressures therein, for example, to the range of $10^{-10}$ torr. Also, the interior of chamber 1 is connected to a source of sputtering gas, e.g., argon (Ar), and also a source of nonactive gas, e.g., hydrogen ($H_2$), along valved ducts 39 and 41, respectively. It is evident that sources of other nonactive gases are provided if the respective partial pressures of such gases within chamber 1 are also to be controlled. During deposition, the respective partial pressures of nonactive gases, e.g., hydrogen, are maintained at a predetermined level; in other words, the ratios of the respective partial pressures of such gases and the sputtering atmosphere are particularly established prior to and maintained constant during the deposition process. As illustrated in FIG. 3, the system of FIG. 1 is particularly calibrated for a particular ratio of sputtering gas, i.e., argon, and nonactive gases, i.e., hydrogen, present in chamber 1. When the system of FIG. 1 is calibrated for a particular ratio $H_2/Ar$, total ion charge Q to a target 9 or 11 provides a direct indication of sputtering yield per incident ion and, hence, the thickness $t$ of target material, or depositant, condensed onto an adjacent substrate 25. To monitor the ratio $H_2/Ar$, a mass spectrometer 43 is connected along valved duct 45 to chamber 1. Subsequent to presputtering, hereinafter described, and the introduction of sputtering gas, i.e., argon, along valved duct 39, the ratio $H_2/Ar$ in chamber 1 is precisely measured and valved duct 41 regulated to establish a predetermined ratio $H_2/Ar$ for which the system has been calibrated. During deposition, the partial pressure of hydrogen in chamber 1 does not vary whereby the ratio $H_2/Ar$ is maintained. Accordingly, the contribution of hydrogen ions $H_2^+$ to the ion charge $I_c$ at targets 9 and 11, respectively, and, hence, sputtering yield per incident ion is known.

Figure 2:
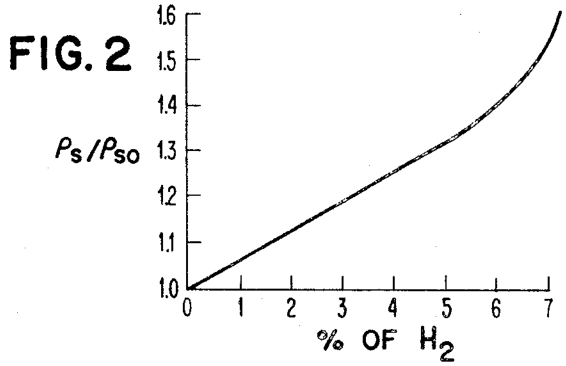
FIG. 2 is a curve illustrating the percentage deviation of sheet resistivity $\rho_s$ of a deposited thin metallic film due to the presence of hydrogen in the sputtering atmosphere.

Initially, pressure within chamber 1 is reduced to $5\times10^{-8}$ torr or less to minimize the effects of residual active gases such that a deposited metallic layer 47 (see FIG. 4) exhibits a bulk resistivity $\rho_b$ substantially equal to that of the alloy material forming target 9. However, a substantial partial pressure of water vapor ($H_2O$) may remain within chamber 1 which dissociates in the glow discharge, to introduce hydrogen ions $H^+$ in chamber 1. The partial pressure of water vapor within chamber 1 can vary considerably depending upon the past history of the system. The presence of nonactive residual gases, e.g., hydrogen, in chamber 1 does not affect resistivity $\rho_b$ of a depositant thin metallic film 47 but, rather, the sputtering yield per incident ion on target 9. Accordingly, for a given total ion charge Q at target 9, the thickness $t$ and, hence, the sheet resistivity $\rho_s$ of thin metallic film 47 is related to the percentage of nonactive gases in the sputtering atmosphere. For example, as shown in FIG. 2 wherein $\rho_{so}$ indicates the sheet resistivity of a deposited thin metallic film with no hydrogen present in the sputtering atmosphere, the percentage deviation of sheet resistivity $\rho_s$ increases as percentage of hydrogen in the sputtering atmosphere is increased. For a given total ion charge Q, a predetermined thickness $t$ of thin metallic film 47 is obtained only when the percentages of the nonactive gases, e.g., hydrogen, in the sputtering atmosphere are controlled with respect to system pressures, i.e., the pressure of the sputtering atmosphere, so as to obtain a predetermined sputtering yield per incident ion. As indicated in FIG. 3, for a given ratio $H_2/Ar$, the sheet resistivity $\rho_s$ of thin metallic film 47 is singularly determined by total ion charge Q at target 9.

As known, the resistance of a thin film resistor element is given by $\rho_s L/W$ or $\rho_b L/tW$, where $\rho_s$ is sheet resistivity, $\rho_b$ is bulk resistivity, $t$ is film thickness, and L and W are the length and width, respectively, of the thin film pattern. Generally, thin film resistor patterns are formed by conventional photolithographic techniques, as described with respect to FIG. 4, whereby the geometry of a thin film pattern is precisely controlled. For all practical purposes, lack of reproducibility of prior art thin film resistor elements resulted from variations in sheet resistivity $\rho_s$ due to wide variations in bulk resistivity $\rho_b$ and, also, thickness $t$ of deposited thin film metallic patterns. In accordance with the described process, bulk resistivity $\rho_b$ is reproducible since the effects of contaminants within chamber 1 are virtually eliminated and approaches that of the target, or cathode, 9. Also, since the ratio $H_2/Ar$ is precisely determined, the sputtering yield per incident ion at target 9 is known and precise control of depositant thickness $t$ is achieved by limiting the total ion charge Q at target structure 9.

The sputtering process herein disclosed is similar to that described by L. Maissel et al., supra, wherein DC substrate biasing is utilized during deposition. DC substrate bias during the deposition process subjects substrate 25 adjacent target 9 to low-energy bombardment by positive ions which dislodge adsorbed impurities and, thus, provide purer films. In prior art processes, contaminants originating on target 9 and also present within chamber 1 would tend to increase the bulk resistivity $\rho_b$ of a deposited thin metallic film. Since the quantity of contaminants varied in uncontrolled fashion, the resistivity $\rho_b$ of the deposited thin metallic film was not reproducible. For example, bulk resistivity $\rho_b$ is given by $\rho_i+\rho_r$ where $\rho_i$ is the ideal resistivity of a pure metal, or solvent in an alloy material, and $\rho_r$ is the residual resistivity due to the presence of contaminants, or solute in an alloy material. In the case of pure metals, bulk resistivity $\rho_b$ is approximately equal to the ideal resistivity $\rho_i$ since the residual resistivity $\rho_r$ reduces to zero in the ideal case. Since the ideal resistivity $\rho_i$ is highly temperature dependent, thin film resistor elements formed of pure metals exhibit a high temperature coefficient of resistance which precludes their useful application. For high speed integrated circuits, the temperature coefficient of resistance of a thin film resistor element is preferably less than 100 p.p.m./° C. whereby the change in total resistivity $\rho_t$ is less than 1% over a temperature range between say 0° C. to 100° C. Since residual resistivity $\rho_r$ is not temperature dependent, thin film resistor elements formed of alloy materials are preferred as they exhibit a lower temperature coefficient of resistance which is substantially constant. To obtain reproducible bulk resistivity $\rho_b$ in thin metallic films formed of alloy material, it is necessary that the composition of such films, i.e., the contaminant level, be precisely controlled and faithfully reproduce the target material.

In accordance with the preferred method of this invention, precision thin film resistors are deposited by sputtering techniques wherein (1) system pressures within chamber 1 are initially reduced, say, to $5\times10^{-8}$ torr to substantially eliminate residual active gases affecting residual resistivity $\rho_r$ of thin metallic film 47; (2) presputtering the target to establish equilibrium conditions within chamber 1 to insure that the composition of thin metallic film 47 is identical to that of target structure 9; and, (3) calibrating the system of FIG. 1 for a given ratio $H_2/Ar$ whereby, for given system parameters, thickness $t$ of thin metallic film 47 is precisely indicated by the total ion charge Q to target 9. For example, total ion charge Q can be monitored by a conventional integrating circuit arrangement 49 connected in parallel across resistor 19. To automate the deposition process, integrating circuit 49 operates switch arrangement 51 to disconnected voltage source 17 when a total ion charge Q indicative of a desired depositant thickness $t$ has been accumulated. A similar arrangement, indicated by primed reference characters, automates the sputtering process with respect to target 11.

To effect the process of this invention, chamber 1 is initially evacuated along valved duct 37 in excess of $5\times10^{-8}$ torr. During evacuation of chamber 1, degassing is effected by energizing heating coil 53 to elevate the temperature of structure 23 and, also, substrates 25, at least in excess of 200° C. When degassing and final system pressures are achieved, substrates 25 are maintained at a predetermined temperature, e.g., 150° C., and chamber 1 sealed along valved duct 37.

A sufficient partial pressure of high purity argon is introduced along the valved duct 39 into chamber 1 to maintain a glow discharge, e.g., 25 microns to 35 microns. The blank surface 27 of structure 23 is positioned adjacent target 9 and shutter elements 29 and 29' are returned to connect source 33 whereby structure 23 along with substrates 25 are biased at −150 volts. When switch 51 is actuated, a glow discharge is struck and target 9 is subjected to high energy, positive ion bombardment. The exterior portions of target 9 are sputtered for a time sufficient, e.g., 30 to 60 minutes, to achieve system equilibrium whereby thin metallic film 47 faithfully reproduces the composition of the target material. At this time substrates 25 are protected from material being sputtered from target 9 by shutter elements 29 and 29'.

When target structure 9 has been conditioned the glow discharge is extinguished by opening switch 51 and shutter elements 29 and 29′ are displaced to allow rotation of structure 23 by means, not shown, external of chamber 1 to position a substrate 25 adjacent target structure 9. When substrate 25 is positioned, a glow discharge is again struck by actuating switch 51 to bias target structure 9. At this time, sputtered target material deposits over the surface of substrate 25 as thin metallic film 47. When the diameter of target 9 is large, e.g., 6 inches, compared to that of substrate 25, e.g., 3 inches, and the spacing therebetween is small, e.g., 1.5 inches, the uniformity of depositant thickness $t$ is in the order of $\pm 1\%$. The initial pumpdown of chamber 1 and also substrate biasing and temperature control result in thin metallic film 47 exhibiting a bulk resistivity $\rho_b$ substantially that of the target material.

Precise control of depositant thickness $t$ insures reproducible sheet resistivity $\rho_s$ of thin metallic film 47. When reproducible bulk resistivity $\rho_b$ is achieved, the sheet resistivity $\rho_s$ is precisely indicated by the total ion charge Q to target 9 only when the sputtering system is calibrated for a particular ratio $H_2/Ar$, i.e., when the sputtering yield per incident ion is known and constant. As hereinabove stated, sputtering yield per incident ion is markedly dependent upon the nature of the sputtering atmosphere and, more particularly, on the nature of the bombarding ions. For example, while hydrogen ion is an effective charge carrier and contributes substantially to the ion charge $I_c$ to target 9, its sputtering yield is negligible as compared to a heavier ion of the sputtering atmosphere, e.g., argon. Accordingly, unless the hydrogen partial pressure is determined at a predetermined level, ion charge $I_c$ to target 9 is not a true indication of supttering yield. Accordingly, the system is calibrated by providing a predetermined ratio $H_2/Ar$ as shown in FIG. 3 whereby the sputtering yield per incident ion on target structure 9 is constant. For given system parameters and when the ratio $H_2/Ar$ is a constant, as shown in FIG. 3, sheet resistivity $\rho_s$ of metallic thin film 47 is precisely determined by controlling the total ion charge Q to target 9. For example, depositant thickness $t$ may be given by the empirical relationship:

$$t = kI_cT/pd$$

where $k$ is a constant for fixed cathode potential and sputtering yield, T is the duration of the sputtering process, $p$ is system pressure, and $d$ is the target-substrate separation. Since the depositant film exhibits a reproducible bulk resistivity $\rho_b$, hereinabove described, and since $I_cT = Q$ and $t = \rho_b/\rho_s$, such equation can be rewritten as $$\rho_s Q = pd\rho_b/k$$

or $\rho_s Q$ = constant. Since sputtering yield per incident ion for a given ratio $H_2/Ar$ within chamber 1 is constant, sheet resistivity $\rho_s$ and, hence, the resistance of a particular thin film pattern is singularly controlled by total cathode charge Q to target 9. Accordingly, when a same ratio $H_2/Ar$ is established for successive deposition processes, total ion charge Q to target 9 provides a precise indication of depositant thickness $t$ as shown in FIG. 3 and, therefore, sheet resistivity $\rho_s$. For example, when Nichrome films are deposited, sheet resistivity $\rho_s$ can be varied continuously between approximately 10 ohms/□ and 50 ohms/□ depending upon the duration of the deposition process as indicated by the total cathode charge Q. Accordingly, when a thin metallic film exhibits a desired sheet resistivity $\rho_s$, i.e., thickness $t$ is indicated by a predetermined total cathode charge Q, integrating circuit 49 opens switch 51 to disconnect source 17 and extinguish the glow discharge. Shutters 29 and 29′ are displaced and structure 23 is rotated to position a next substrate 25 adjacent target 9. Switch 57 is actuated to again strike a glow discharge whereby a thin metallic film 47 is deposited over the next substrate 25. In this fashion, thin metallic films 47 are deposited over each of substrates 25.

As hereinabove described, a protective layer 55 shown in FIG. 4, is deposited over each thin metallic film 47 to prevent oxidation thereof. When planar surface 27 of structure 23 is adjacent target 11, target 11 is conditioned, as hereinabove described, by actuating switch 51′ whereby a glow discharge is struck. When target 11 has been conditioned and a substrate 25 having a thin metallic film 47 is advanced, a thin metallic film 47 and a protective layer 55 can be concurrently deposited. Total ion charge Q at target 11 is monitored by integrating circuit 49′ which actuates switch 51′ when protective layer 55 of desired thickness has been formed. When a thin metallic layer 47 and a protective layer 55 have been formed over each substrate 25, chamber 1 is broken and substrates 25 are removed and subjected to photolithographic precesses to define thin film resistor elements.

Figure 4A:
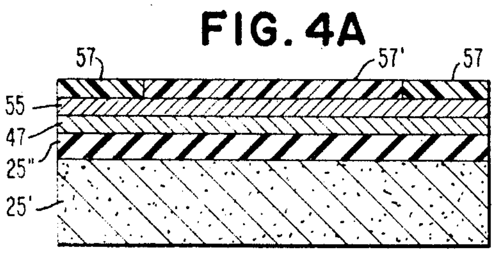
FIG. 4 illustrates a sequence of steps for photolithographically defining a thin film resistor element.
Figure 4B:
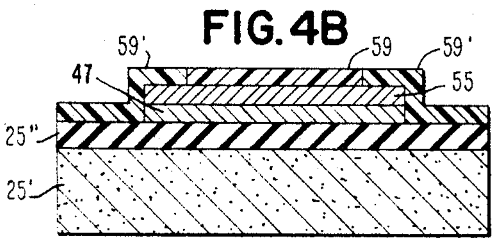
Figure 4C:
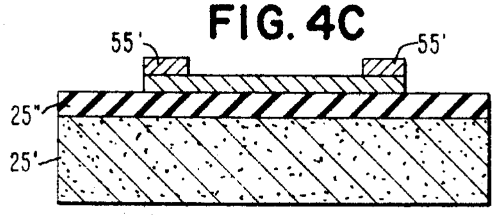

As shown in FIG. 4A, a substrate 25 having both a deposited thin metallic film 47 and also a protective layer 55, e.g., aluminum (Al), gold (Au), etc., is shown during the photolithographic process whereby a thin film resistor element is defined. The substrate 25 may, for example, be a ceramic wafer or, as illustrated, a semiconductor wafer 25′ having formed thereon a thin layer of silicon dioxide 25″. By conventional techniques, a thin layer of appropriate photoresist material 57, e.g., Kodak Photoresist, is applied over protective layer 55 and selected portions 57′ are reacted and rendered etch-resistant. When photoresist layer 57 is developed, reacted portion 57′ remain and define the desired thin film resistor pattern. When exposed to an appropriate etchant, or ionic bombardment in an RF glow discharge, exposed surfaces of protective layer 55 and also thin metallic film 47 are etched and reacted portions 57′ of the photoresist layer are subsequently removed by an appropriate solvent. A second layer of photoresist material 59 is applied over the resulting structure as shown in FIG. 4B, selected portions 59′ being reacted. Photoresist layer 59 is developed and the resulting structure is exposed to an appropriate etchant, e.g., sodium hydroxide (NaOH), potassium hydroxide (KOH), etc., selective as to protective layer 55. When exposed portions of protective layer 55 are etched, reacted portions 59′ of the photoresist layer are removed by appropriate solvent. The resulting thin film resistor is shown in FIG. 4C, remaining portions 55′ of protective layer 55 facilitate electrical connection to the thin film resistor element defined by the remaining portion of thin metallic film 47. It is evident to those skilled in the art that the metallization for integrating the thin film resistor element into a circuit arrangement can be effected by a separate metallization process or during the step illustrated in FIG. 4B whereby interconnections are defined by portions of protective layer 55.

While the invention has been shown and described with respect to a DC bias sputtering process, it will be understood by those skilled in the art that various changes in form and detail may be made therein without departing from the spirit and scope of the invention. Particular aspects of the described invention are generally applicable to ion bombarding processes, e.g., RF sputtering, reactive sputtering, etc., for depositing metallic or nonmetallic layers. The initial pumpdown of the system, as hereinabove described, eliminates active residual gases whereby contamination of depositant layers is substantially eliminated whereas control of the respective partial pressures of nonactive gases which possess low sputtering yields, e.g., hydrogen ($H_2$), helium (He), etc., allows calibration of the system to provide precise monitoring of depositant thickness.

What is claimed is:

1. A process for depositing a thin layer of a first material comprising the steps of positioning a target of said first material and a substrate within a chamber, providing and maintaining a gaseous sputtering atmosphere within said chamber having a known sputtering rate per incident ion on said target when a glow discharge is struck to said target, striking a glow discharge to said target whereby said target is sputtered and said first material is deposited on said substrate, measuring the integrated ion charge to said target to determine the thickness of said first material deposited on said substrate and interrupting the deposition of said first material on said substrate when a predetermined integrated ion charge to said target is measured.

2. A process for depositing a thin layer of a first material having a controlled thickness comprising the steps of positioning a target of said first material and a substrate within a chamber containing a gaseous sputtering atmosphere including at least one gaseous material having a sputtering rate different from that of the major constituent of said sputtering atmosphere, establishing and maintaining the partial pressure of said gaseous material at a predetermined level to provide a known sputtering rate per incident ion on said target when a glow discharge is struck to said target, striking a glow discharge to said target whereby said target is sputtered and said first material is deposited on said substrate, measuring the integrated ion charge to said target to ascertain the thickness of said first material deposited on said substrate and interrupting the deposition of said first material on said substrate when a predetermined integrated ion charge to said target is measured.

3. The process of claim 2 including the further step of establishing and maintaining a predetermined ratio of the respective partial pressures of said gaseous material and said major constituent of said sputtering atmosphere within said chamber to provide a known sputtering rate per incident ion on said target.

4. The process of claim 2 including the further steps of evacuating said chamber, introducing into said chamber a predetermined partial pressure of argon at least sufficient to support a glow discharge in said chamber, said chamber further containing residual partial pressure of hydrogen, and establishing and maintaining a predetermined ratio of the respective partial pressures of argon and hydrogen within said chamber to provide a known sputtering rate per incident ion on said target when said glow discharge is struck.

5. The process of claim 2 including the further step of heating said substrate during deposition of said first material.

6. The process of claim 2 including the further step of biasing said substrate during deposition of said first material whereby said substrate is subjected to low energy ion bombardment to remove adsorbed impurities therefrom.

7. The process of claim 2 including the further step of photolithographically defining a predetermined pattern of said first material on said substrate.

8. The process of claim 2 including the further step of limiting total ion charge to said target whereby the thickness of said first material deposited on said substrate is controlled.

9. The process of claim 2 wherein said first material is a metallic alloy and including the further steps of evacuating said chamber to a pressure between $1\times10^{-7}$ torr and $1\times10^{-10}$ torr, and introducing said sputtering atmosphere into said chamber at a pressure at least sufficient to support said glow discharge.

10. The process of claim 9 including the further step of conditioning said target by striking a glow discharge to said target while shielding said substrate for a time sufficient to establish equilibrium conditions for the deposition of said first material on said substrate.

11. A process for depositing a thin film resistor element comprising the steps of positioning a target of resistive material and a substrate within a chamber, evacuating said chamber, introducing a predetermined pressure of sputtering gas at least sufficient to maintain a glow discharge within said chamber, said chamber containing a residual partial pressure of at least one gaseous material having a sputtering rate different from that of said sputtering gas, establishing and maintaining a predetermined ratio of said one gaseous material and said sputtering gas within said chamber to provide a predetermined sputtering rate per incident ion on said target, striking a glow discharge to said target whereby said target is sputtered and said resistive material deposits as a thin film onto said substrate, measuring the integrated ion charge to said target to determine the thickness of said thin film deposited on said substrate and interrupting the deposition of said first material on said substrate when a predetermined integrated ion charge to said target is measured.

12. The process of claim 11 including the further step of evacuating said chamber to a pressure below $1\times10^{-7}$ torr prior to the introduction of said sputtering gas within said chamber.

13. The process of claim 11 including the further step of forming said target of a nickel-chromium alloy.

14. The process of claim 11 including the further step of applying a negative DC bias to said substrate during deposition of said resistive material on said substrate while maintaining said substrate at an elevated temperature.

15. The process as defined in claim 11 including the further steps of positioning a second target of conductive material within said chamber, and striking a glow discharge to said second target subsequent to the deposition of said thin film on said substrate to form a protective layer thereover and prevent oxidation of said thin film when exposed to atmosphere.

16. The process as defined in claim 15 including the further step of forming said second target of a material selected from the group consisting of aluminum and gold.

17. A process for depositing thin film resistors comprising the steps of positioning a target formed of a nickel-chromium alloy material and a substrate within a chamber, evacuating said chamber to a pressure between $1\times10^{-7}$ torr and $1\times10^{-10}$ torr, introducing a given pressure of sputtering gas within said chamber at least sufficient to maintain a glow discharge therein, said chamber containing a partial pressure of a gaseous material having a sputtering rate different from that of said sputtering gas, establishing and maintaining a predetermined ratio of the respective pressures of said sputtering gas and said gaseous material in said chamber whereby sputtering rate per incident ion on said target is ascertained, striking a glow discharge to said target whereby said target is sputtered and said alloy material deposits on said substrate as a thin film, maintaining said substrate at an elevated temperature between 100° C. and 200° C. during deposition of said thin film, measuring the integrated ion charge to said target to measure the thickness of said thin film deposited on said substrate and interrupting the deposition of said first material on said substrate when a predetermined integrated ion charge to said target is measured.

18. The process of claim 17 including the further step of limiting total ion charge to said target whereby a thin film of predetermined thickness is deposited on said substrate.

19. The process of claim 17 including the further step of selecting said sputtering atmosphere to consist of argon at a pressure between 25 microns and 35 microns.

20. The process of claim 17 including the further step of applying a negative DC bias to said substrate during deposition of said thin film.

21. The process of claim 17 including the further step of evacuating said chamber between $5\times10^{-8}$ torr and $1\times10^{-10}$ torr.

References Cited

UNITED STATES PATENTS 3,336,154 8/1967 Oberg et al. -------- 204—192

ROBERT K. MIHALEK, *Primary Examiner.*